US007473572B2

United States Patent
Dehe et al.

(10) Patent No.: US 7,473,572 B2
(45) Date of Patent: *Jan. 6, 2009

(54) MICROMECHANICAL SENSORS AND METHODS OF MANUFACTURING SAME

(75) Inventors: Alfons Dehe, Neufahrn (DE); Marc Fueldner, Munich (DE)

(73) Assignee: Infineon Technologies AG, Munich (DE)

( * ) Notice: Subject to any disclaimer, the term of this patent is extended or adjusted under 35 U.S.C. 154(b) by 323 days.

This patent is subject to a terminal disclaimer.

(21) Appl. No.: 11/339,046

(22) Filed: Jan. 24, 2006

(65) Prior Publication Data

US 2006/0141656 A1 Jun. 29, 2006

Related U.S. Application Data

(60) Division of application No. 10/866,582, filed on Jun. 11, 2004, now Pat. No. 7,190,038, which is a continuation of application No. PCT/EP02/12783, filed on Nov. 14, 2002.

(30) Foreign Application Priority Data

Dec. 11, 2001 (DE) ................. 101 60 830

(51) Int. Cl.
*H01L 21/00* (2006.01)
(52) U.S. Cl. ................................. 438/48; 438/53
(58) Field of Classification Search ............. 438/48, 438/50–53
See application file for complete search history.

(56) References Cited

U.S. PATENT DOCUMENTS

| 4,522,795 | A | * | 6/1985 | Li ............................. 423/300 |
| 5,146,435 | A |   | 9/1992 | Bernstein .................... 367/181 |
| 5,870,482 | A |   | 2/1999 | Loeppert et al. ............. 381/174 |
| 6,140,689 | A | * | 10/2000 | Scheiter et al. ............. 257/414 |
| 6,357,299 | B1 |   | 3/2002 | Aigner et al. |
| 6,373,115 | B1 |   | 4/2002 | Kolb et al. .................. 257/414 |
| 6,870,939 | B2 |   | 3/2005 | Chiang et al. ............... 381/175 |
| 7,253,016 | B2 | * | 8/2007 | Barzen et al. ................. 438/53 |
| 2001/0015106 | A1 |   | 8/2001 | Aigner et al. ................. 73/775 |
| 2001/0024711 | A1 |   | 9/2001 | Werner et al. ............... 428/138 |

FOREIGN PATENT DOCUMENTS

DE     197 41 046 C1   5/1999
WO     WO 00/09440     2/2000

OTHER PUBLICATIONS

Q. Zou et al.; "Design and Fabrication of Silicon condenser Microphone Using Corrugated Diaphragm Technique"; Journal of Microelectromechanical Systems, vol. 5, No. 3; pp. 197-204, Sep. 1996.

(Continued)

*Primary Examiner*—Tuan H Nguyen
(74) *Attorney, Agent, or Firm*—Eschweiler & Associates, LLC

(57) ABSTRACT

A micromechanical sensor and, in particular, a silicon microphone, includes a movable membrane and a counter element in which perforation openings are formed, opposite to the movable membrane via a cavity. The perforation openings are formed by slots, the width of which maximally corresponds to double the spacing defined by the cavity between the membrane and the counter element.

9 Claims, 5 Drawing Sheets

OTHER PUBLICATIONS

A.E. Kabir et al.; "High Sensitivity Acoustic Transducers with Thin P+ Membranes and Gold Back-Plate"; Sensors and Actuators 78; 138-142, Mar. 1999.

J. Bergqvist et al.; "Capacitive Microphone with a Surface Micromachined Backplate Using Electroplating Technology"; Journal of Microelectromechanical Systems, vol. 3, No. 2; pp. 69-75, Jun. 1994.

J. Bergqvist; Finite-element modelling and characterization of a silicon condenser microphone with a highly perforated backplate; Sensors and Actuators A, 39; 191-200, 1993.

T. Bourouina, et al.; "A new condenser microphone with a p+ silicon membrane"; Sensors and Actuators A, 31; 149-152, 1992.

A. Kovacs, et al.; "Fabrication of single-chip polysilicon condenser structures for microphone applications"; J> Micromech. Microeng. 5; 86-90, 1995.

M. Fuldner et al.; "Silicon microphone with high sensitivity diaphragm using SOI substrate"; Eurosensors XIV; M3W3; pp. 123-124, Aug. 2000.

Wolfgang Kuhnel, Darmstadt; "Kapazitive Siliziummikrofone"; VDI Verlag, 1992.

* cited by examiner

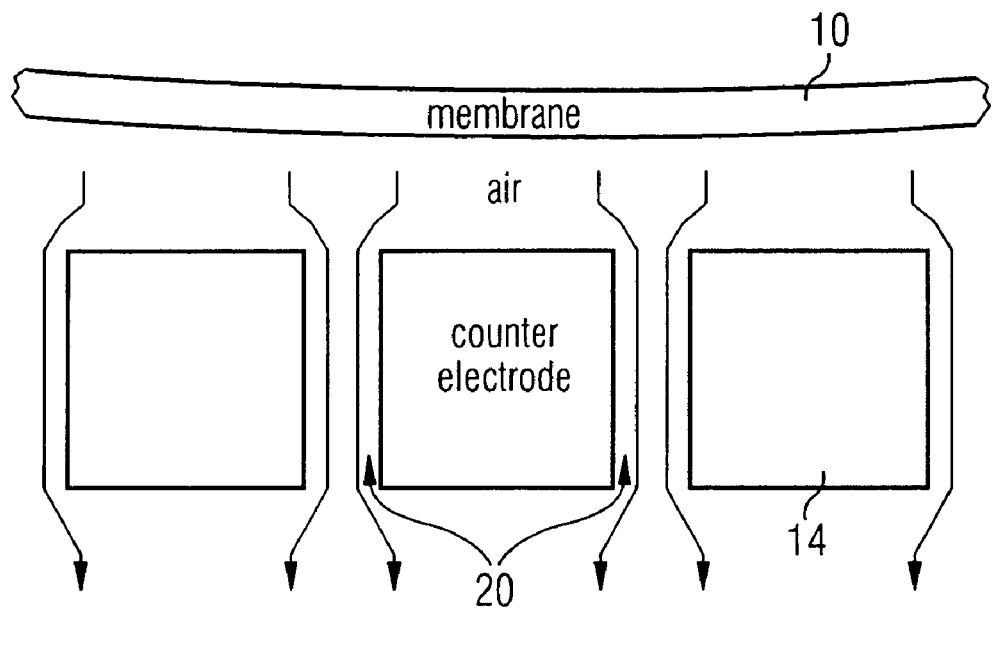
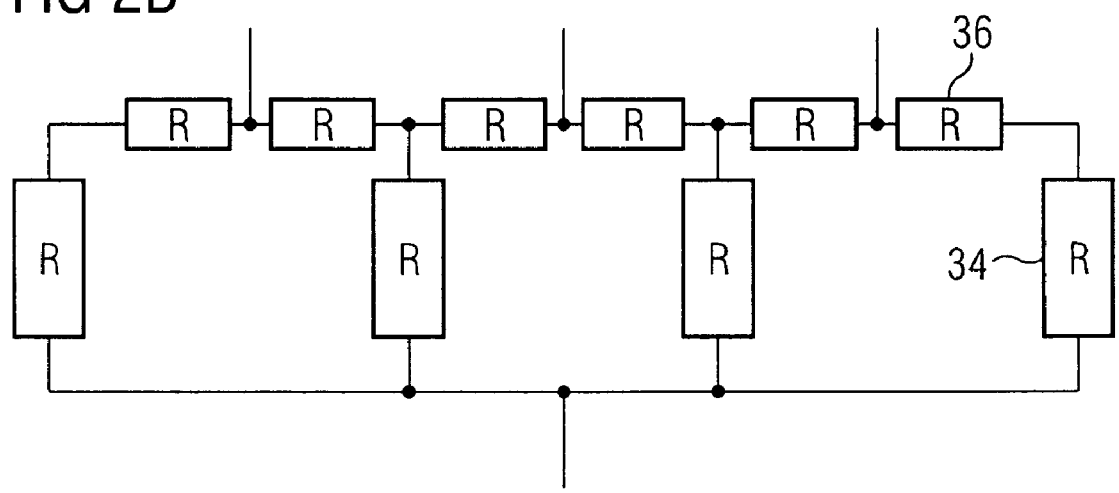

MICROMECHANICAL SENSORS AND METHODS OF MANUFACTURING SAME

CROSS-REFERENCE TO RELATED APPLICATION

This application is a divisional of pending U.S. patent application Ser. No. 10/866,582 filed Jun. 11, 2004, now U.S. Pat. No. 7,190,038; which is a continuation of International Application No. PCT/EP02/12783, filed Nov. 14, 2002, which designated the United States, and claims priority to German application no. 101 60 830.6 filed on Dec. 11, 2001, which are incorporated herein by reference in their entirety.

FIELD OF THE INVENTION

The present invention relates to micromechanical sensors and methods of manufacturing same and, in particular, to so-called micromechanical one-chip sensors for the manufacture of which a wafer is required.

BACKGROUND OF THE INVENTION

In micromechanical sensors, of which a silicon microphone is an example, there are often air-filled cavities having very small dimensions. In a microphone, this is, for example, the air-filled sensor capacity consisting of a sensitive membrane and a rigid counter electrode. Due to the small air volume, the entrapped air applies a strong restoring force on the sensor membrane. This rigidity of the entrapped air lowers the sensitivity of the sensor.

It is known to provide discharge possibilities for the air, wherein this, in silicon microphones, takes place by perforation of the counter electrode. By means of such a perforation, the air can escape from the capacitor gap, i.e. the cavity between the sensitive membrane and the rigid counter electrode.

A large number of microphones and micromechanically manufactured microphones are known from the prior art.

Commercial electret microphones comprise geometries in an order of magnitude in which the rigidity of the air cushion is negligible. These microphones do not have the advantages of a temperature-stable silicon microphone when produced in large numbers.

In micromechanically manufactured microphones, such ones having electroplated counter electrodes are known in which the counter electrode is finally electroplated on the microphone chip. As regards such microphones, reference is, for example, made to Kabir et al., High sensitivity acoustic transducers with p+membranes and gold black-plate, Sensors and Actuators 78 (1999), pp. 138-142; and J. Bergqvist, J. Gobet, Capacitive Microphone with surface micromachined backplate using electroplating technology, Journal of Microelectromechanical Systems, Vol. 3, No. 2, 1994. In methods of manufacturing such microphones, the size of holes in the counter electrode can be selected such that the acoustic resistance is very small and does not influence the microphone sensitivity. The complicated process of electroplating is, however, of disadvantage.

Two-chip microphones are also known from the prior art, in which the membrane and the counter electrode are manufactured on respective separate wafers. The microphone capacity is then obtained by bonding the two wafers. As regards such a technology, reference is made to W. Kuhnel, Kapazitive Silizium-Mikrofone (Capacitive Silicon Microphones), series 10, Informatik/Kommunikationstechnik, No. 202, Fortschrittsberichte, VDI, VDI-Verlag, 1992, Dissertation; J. Bergqvist, Finite-element modelling and characterization of a silicon condenser microphone with highly perforated backplate, Sensors and Actuators 39 (1993), pp. 191-200; and T. Bourouina et al., A new condenser microphone with a p+ silicon membrane, Sensors and Actuators A, 1992, pp. 149-152. It is, as far as technology is concerned, also possible in this type of microphone to choose adequately large diameters for the holes in the counter electrode. For reasons of cost, however, one-chip solutions are preferred. In addition, the calibration of the two wafers is problematic in two-chip microphones.

In one-chip microphones mentioned before, the counter electrode is manufactured in an integrated way, i.e. only one wafer is required. The counter electrode is made of a silicon substrate and is formed by means of deposition or epitaxy. Examples of such one-chip microphones are described in Kovacs et al., Fabrication of singe-chip polysilicon condenser structures for microphone applications, J. Micromech. Microeng. 5 (1995), pp. 86-90; and Füldner et al., Silicon microphone with high sensitivity diaphragm using SOI substrate, Proceedings Eurosensors XIV, 1999, pp. 217-220. In the manufacturing processes for these one-chip microphones, it is required or of advantage to close the holes in the counter electrode again for the following processing in order to smooth the topology. In the well-known micromechanically machined microphones described above, the perforation openings in the counter electrodes have a squared or circular cross-sectional form.

A manufacturing process for such one-chip microphones is known from WO 00/09440. In this method for manufacturing, the perforation openings are formed at first in an epitaxial layer formed on a wafer. Subsequently, an oxide deposition on the front side of the epitaxy layer is performed so that the perforation openings are closed on the one hand and a spacing layer, the thickness of which defines the future gap between the membrane and the counter electrode is formed on the other hand. A silicon membrane having the required thickness is then deposited on this layer. After the required processing of the electronic elements, the wafer is etched from the backside down to the epitaxy layers in the region of the perforation openings. Subsequently, etching of the oxide from the backside takes place for opening the perforation openings and the cavity between the membrane and the counter electrode. A part of the sacrificial layer between the membrane and the epitaxy layer thus remains as a spacing layer between the membrane and the counter electrode.

A method of manufacturing a one-chip microphone is known from DE 19741046 C1, in which the counter electrode is patterned so to speak in a final manufacturing step after producing the membrane. Thus, it is possible in this method to produce holes having a diameter of about 25 µm to 50 µm or squares having an edge length of about 25 µm as perforation openings. In addition, this text teaches providing perforation openings in the counter electrode which have the form of a rectangle which, with its longitudinal sides, extends over almost the entire edge length of the squared counter electrode and the width of which corresponds to the edge length of the squares indicated above.

Finally, capacitive transducers are known from U.S. Pat. No. 5,870,482, in which border regions of a mounted membrane, together with a counter electrode, serve as capacitive receptors. In one example, a round membrane mounted in its middle section is provided, while the outer border region, together with a counter electrode spaced apart between 1 µm and 4 µm, forms a capacitor. 14 µm slots having a spacing of 24 µm are provided in the counter electrode.

SUMMARY OF THE INVENTION

It is the object of the present invention to provide a highly sensitive micromechanical sensor which can be manufactured in a flexible way, as well as a method of manufacturing such a sensor.

In accordance with a first aspect, the present invention provides a micromechanical sensor having a movable membrane and a counter element in which perforation openings are formed, opposite the movable membrane via a cavity, wherein the perforation openings are formed by slots, the width of which maximally corresponds to double the spacing defined by the cavity between the membrane and the counter element.

In accordance with a second aspect, the present invention provides a method of manufacturing a micromechanical sensor, having the following steps: producing slot-formed perforation openings in a layer; producing an essentially planar oxide layer on the layer in which the perforation openings are formed, with a thickness corresponding to the future spacing between a counter element and a membrane of the micromechanical sensor, using a front-side oxide deposition on the layer provided with the perforation openings, wherein the width of the slot-formed perforation openings maximally corresponds to double the thickness of the oxide layer; depositing the membrane on the essentially planar oxide layer; and performing of etching for opening the perforation openings and for producing a cavity in the oxide layer between the membrane and the counter element in which the perforation openings are formed.

The present invention is based on the finding that the sensitivity of micromechanical sensors depends on the perforation density and on the size of the perforation openings formed in an element adjacent to a sensor cavity. In particular, the resulting acoustic resistance determines the upper cut-off frequency of the microphone sensitivity in a micromechanical microphone depending on the perforation density and the size of the individual holes.

The present invention includes a novel perforation having slot-formed holes which are preferably arranged uniformly over the counter element, in the preferred embodiment of a silicon microphone, over the counter electrode. According to the invention, the slots have a width which maximally corresponds to double the spacing defined by the cavity between the membrane and the counter element so that the processing of this perforation can easily be integrated into any overall process. Slots having such a width can be closed easily when manufacturing the inventive sensor by depositing the layer which is etched later for producing the cavity since they grow to be closed from both sides when depositing so that a safe closing of the perforation openings results with the size ratios given.

Such a maximal width of the slots, preferably together with a limited length of them, also ensures a sufficient stability of the counter element or the counter electrode. In addition, a defined rigidity of the counter element or the counter electrode can be ensured when the slots are formed in at least two different directions. The slots arranged in different directions are thus preferably distributed alternatingly and uniformly over the counter element. According to the invention, the slots or slot groups are arranged in respective rows and columns in the counter element, wherein the rows and columns are offset compared to one another. The acoustic friction resistance of the slot-formed perforation is considerably smaller than in the conventional round or squared holes with an equal effective degree of opening.

According to the invention, longitudinal trenches instead of round or squared holes are used for perforating. With an equal area density of the perforation, the viscous flow resistance of air is reduced by the perforation so that the area of usage of the respective sensor, such as, for example, the bandwidth of the microphone, is increased. Apart from the microphones described in the following as preferred embodiments, the present invention is also applicable to different micromechanical sensors having a cavity arranged between a counter element and a membrane, wherein only acceleration sensors, force sensors and the like are to be mentioned as examples. In addition, the present invention is not limited to such sensors in which a capacitive detection takes place, but is also applicable to sensors utilizing a piezo-electric effect or the like for producing a sensor signal.

BRIEF DESCRIPTION OF THE DRAWINGS

Preferred embodiments of the present invention will be detailed subsequently referring to the appendage drawings, in which:

FIGS. 2a and 2b are schematic illustrations for explaining the flow resistance through perforations openings;

DETAILED DESCRIPTION OF THE PREFERRED EMBODIMENTS

Figure 1:
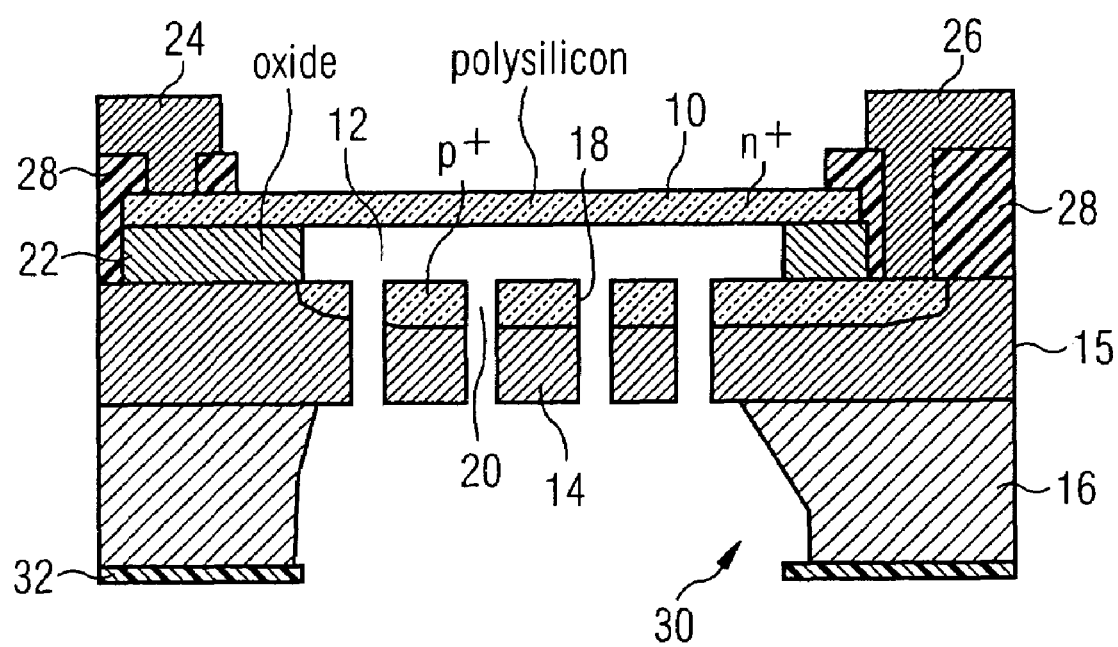
FIG. 1 shows a schematic cross-sectional view of an inventive micromechanical sensor.

Referring to FIG. 1, the general setup of an inventive silicon microphone is to be described at first, wherein such a microphone can be manufactured with advantage using the method described in WO 00/09440.

As can be seen from the schematic cross-sectional view of FIG. 1, the one-chip silicon microphone comprises a movable membrane 10 made of an $n^+$-doped polysilicon. The membrane 10, via a sensor cavity 12, is opposite to a counter electrode 14 formed by areas of an epitaxy layer 15 formed on a substrate 16. A $p^+$-doping area 18 and perforation openings 20 are formed in the counter electrode 14.

The membrane 10 is attached to the counter electrode via a spacing layer 22 which in the embodiment shown consists of oxide. A first terminal electrode 24 is connected to the membrane 10 in an electrically conductive way, while a second terminal electrode 26 is connected to the doping area 18 of the counter electrode 14 in an electrically conductive way. For this purpose, an insulating layer 28 is usually provided.

An opening 30 is provided in the substrate 16 below the section of the epitaxy layer 15 serving as the counter electrode 14 so that the perforation openings 20 connect the cavity 12 to the substrate opening 30 fluidically. The opening 30 can be etched into the substrate 16, wherein in FIG. 1 a layer 32 which can serve as a masking layer for such etching of the opening 30 is shown schematically.

Since the mode of operation of the sensor shown in FIG. 1 is obvious for those skilled in the art, it is only mentioned briefly that a deflection of the membrane 10 takes place by acoustic waves impinging on it so that a capacity change which takes place due to the changed distance between the membrane 10 and the counter electrode 14, can be detected between the terminal electrodes 24 and 26.

In order to reduce the influence of air in the cavity 12 on the sensitivity and the response behavior of the sensor, the perforation openings 20 serving as discharge openings are provided in the counter electrode. Air can escape from the capacitor gap, i.e. into the cavity 12, through these perforation openings 20, wherein the resulting acoustic resistance determines the upper cut-off frequency of the microphone sensitivity depending on the perforation density and the size of the individual holes.

A portion of the membrane 10 in a deflected state is shown schematically in FIG. 2, wherein only a portion of the counter electrode 14 is illustrated. By the deflection of the membrane 10, air between the membrane 10 and the counter electrode 14 is displaced and forced through the perforation openings 20. The perforation openings 20 thus act like a parallel connection of acoustic resistors, as is shown in FIG. 2b. The resistors 34 shown in FIG. 2b with large dimensions thus represent the acoustic resistance produced by a respective perforation opening itself, while the resistors 36 shown with small dimensions are due to the flow resistance towards the respective perforation openings. The entire flow resistance thus is composed of a portion parallel to the counter electrode, i.e. the flow towards the perforation openings, and a portion through the perforation openings. The flow resistance is thus defined by the width, length and height of the perforation openings as well as by the respective arrangement and density of the perforation openings.

The present invention provides micromechanical sensors in which the entire flow resistance and thus the acoustic resistance can be decreased considerably. Such a decrease cannot be obtained by simply increasing the perforation density at will since the static counter electrode must be sufficiently rigid. In addition, the flow resistance cannot be decreased at will by arbitrarily increasing the cross-section or edge length of well-known round or square perforation openings since such perforation openings in this case can no longer be closed by a deposition of layer 22 with a height corresponding to that of the cavity so that such microphones can only be manufactured under certain circumstances or with increased expenditure. With round or squared holes of the size which can be realized, the high acoustic resistance of the viscous pipe flow thus causes a decrease of the microphone sensitivity with high frequencies.

The present invention makes possible a considerable decrease of the flow resistance compared to well-known round or square perforation openings by providing slot-formed perforation openings. In order to make a closing of the perforation opening possible for the following processing in order to smooth the topology, the slot-formed openings, i.e. the trenches, according to an aspect of the present invention comprise a width of maximally double the spacing defined by the cavity between the membrane and the counter element. In order to keep layer tensions in the oxide layer by means of which the perforation openings are closed limited and to prevent the fact that thicker oxide layers than required must be deposited, the slots according to the invention preferably have a width of at most 2 µm.

The length of the inventive slots or trenches can be selected to be considerably larger, wherein the length of the slots can, for example, correspond to double or triple the slot width. In any case, it is preferred for the trench length to be only a fraction of the dimensions of the exposed counter electrode in order to ensure a sufficient stability of the counter electrode. In any case, the length of the individual slots preferably is less than half the dimension of the counter electrode.

It can be shown by means of equations modelling the viscous, laminar pipe or gap flow that the acoustic resistance of a trench, with a constant cross-sectional area, is considerably smaller than with a round or squared hole. Thus, short narrow trenches allow a densely packed arrangement with a small inflow resistance with a simultaneous high stability of the counter electrode.

Figure 3A:
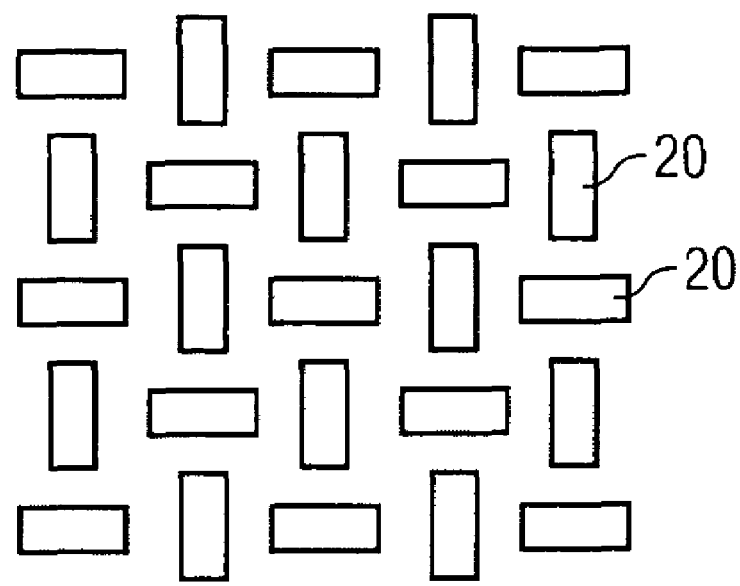
FIGS. 3a and 3b are schematic illustrations showing an embodiment of perforation openings provided according to the invention.
Figure 3B:
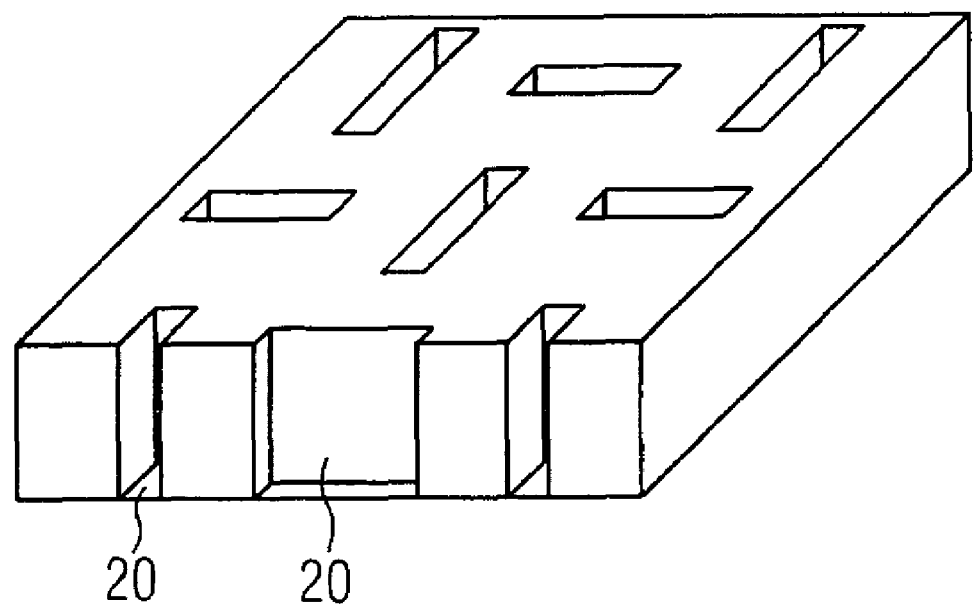

A preferred embodiment for the arrangement of such slot-formed perforation openings is a periodic and offset arrangement of relatively short and narrow trenches, ensuring a strongly decreased flow resistance on the one hand and a high stability of the counter electrode on the other hand. Such an arrangement is shown in FIGS. 3a and 3b. The slots 20 in this embodiment are arranged in two directions perpendicular to each other, i.e. longitudinally and crossways and alternatingly in each of the two directions. FIG. 3a shows a top-view of such slots, while a schematic perspective illustration with a section through the counter electrode is shown in FIG. 3b. The slots 20 shown in FIGS. 3a and 3b can, for example, have a width of 1.5 to 2.5 µm and a length of 5 to 10 µm, wherein the width in one preferred embodiment essentially is 2 µm, while the length essentially is 6 µm.

Figure 4:
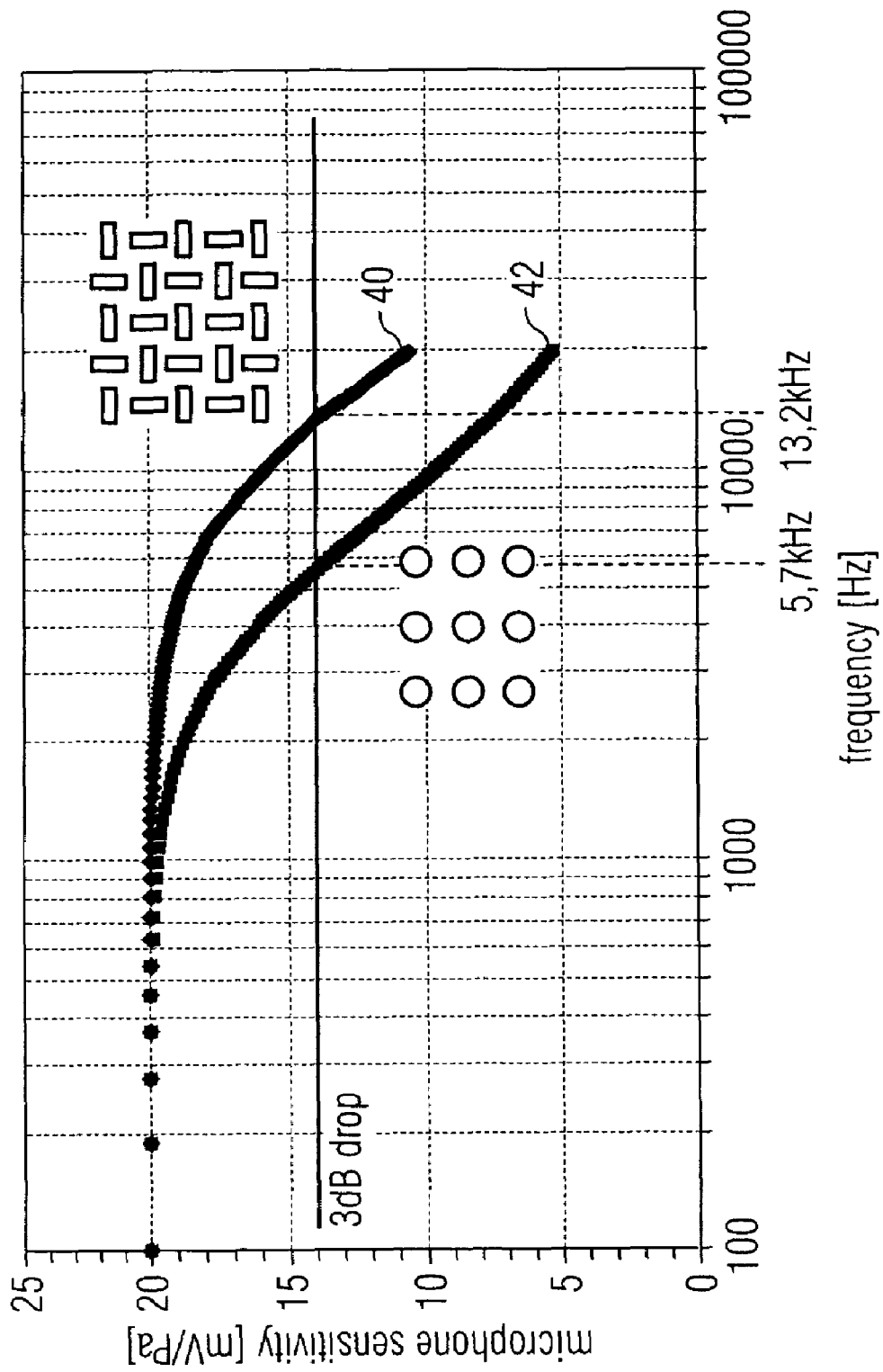
FIG. 4 is a diagram showing a comparison of the microphone sensitivity of the an inventive microphone and that of a well-known microphone.

In FIG. 4, curve 40 shows the microsensitivity of a microphone comprising the offset structure shown in FIG. 3a of perforation trenches in the counter electrode of it, compared to the frequency, while curve 42 illustrates the sensitivity of a conventional microphone having round perforation openings. In both microphones, the perforation area is 25% of the entire area. The hole diameter or the trench width for establishing the curves 40 and 42 was 2 µm. As can be easily seen from the microsensitivity illustrated in FIG. 4 compared to the frequency, the upper cut-off frequency is more than doubled from 5.7 kHz to 13.2 kHz by the inventive perforation using trenches.

Figure 5:
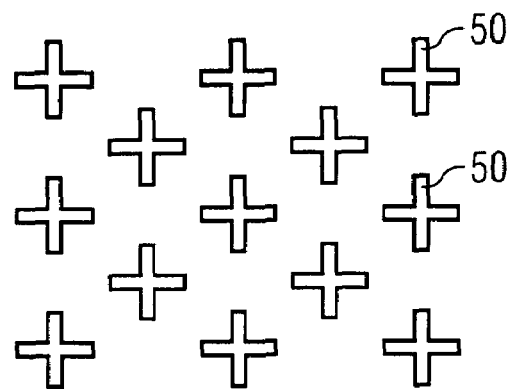
FIGS. 5, 6a and 6b are schematic illustrations of perforation openings according to further embodiments of the present invention.

A further embodiment of inventive perforation openings is shown in FIG. 5. In this figure, two respective perforation slots arranged in directions which are perpendicular to each other cross and form slot crosses 50. The slot crosses 50 are arranged in rows, wherein the slot crosses of neighboring rows are offset by one another and each arranged in the middle between two neighboring slot crosses. Since the distance of the trench walls is larger in the middle of each slot cross 50, it is of advantage to make the trench width slightly smaller than in the case that the slots do not cross in order to make a closing of the slot crosses with sacrificial oxide possible.

According to the invention, the slot-formed perforation openings are distributed as evenly as possible over the area of the counter electrode, wherein the offset arrangement described is of advantage for this purpose. The periodicity of the regular grating is predetermined by the area proportion of the perforation compared to the overall area, wherein the area proportion selected must ensure a sufficiently rigid counter electrode with an active capacitor area. The offset arrangement further results in a dense arrangement of the perforation trenches so that the flow resistance of air from the gaps to the perforation openings is minimized.

Apart from the embodiments described, it is possible to arrange the slots arranged in different directions with another angle than 90° between them, wherein the advantage of an increased stability of the counter electrodes can still be realized. Preferably, the slots arranged in different directions are disposed in an alternating way to one another, wherein it is possible to arrange slots in more than two different directions.

Figure 6A:
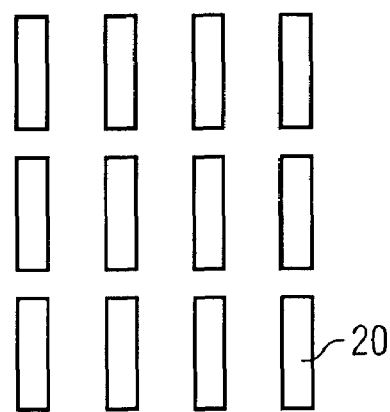
Figure 6B:
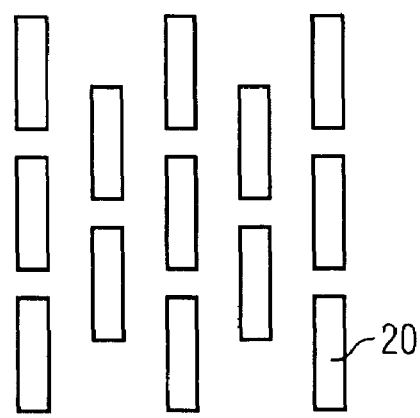

An alternative arrangement of perforation slots is shown in FIG. 6a, wherein the perforation slots are arranged in the same direction in respective rows and columns without any offset between them. In FIG. 6b, another alternative arrangement is shown, in which the perforation slots are arranged in the same direction in rows and columns, wherein the slots of neighboring columns are, however, offset to one another.

According to the invention, both the small slot width and the arrangement of the perforation slots in different directions contribute to an increased stability of the electrode compared to well-known sensors. Another increase in stability can be obtained by the described periodical and offset arrangement of relatively short narrow trenches. The narrow trenches also make possible using any method for manufacturing in which the sensor membrane is manufactured after producing the perforation openings.

A preferred embodiment of an inventive method for manufacturing the micromechanical sensor shown in FIG. 1 will now be discussed briefly. In this method, the slot-formed perforation openings 20 are at first formed in the epitaxy layer 15 which, preferably, has already been provided with the $p^+$-doped area 18, while the opening 13 is not yet provided in the substrate 16. After producing the slot-formed perforation openings 20, the oxide layer 22 is deposited in the required thickness, wherein the perforation openings are thus closed. The perforation openings 20 thus comprise such a width which enables the openings to be closed when depositing the oxide layer 22 with the thickness as determined and which further results in an essentially planar surface of the oxide layer 22 deposited. Subsequently, the silicon membrane 10 can be formed directly on the oxide layer 22.

Subsequently, the front side of the resulting structure is processed, for example to form the terminals 24 and 26, wherein electronic elements are preferably manufactured in a conventional way in neighboring areas of the epitaxy layer. In a final step, the substrate 16 is opened from the backside using a corresponding mask layer 32 in order to expose the perforation openings closed with the oxide. Subsequently, selective etching of the oxide in the perforation openings 20 and of the oxide layer 22 takes place in a conventional way to produce the cavity 12. As regards such a method for manufacturing a micromechanical sensor, with the exception of the perforation openings formed as slots, reference is made to WO 00/09440.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

We claim:

1. A method of manufacturing a micromechanical sensor, comprising the following steps:
    producing slot-shaped perforation openings in a layer;
    producing an essentially planar oxide layer on the layer in which the slot-shaped perforation openings are formed, with a thickness corresponding to a future distance between a counter element and a membrane of the micromechanical sensor, using a front-side oxide deposition on the layer provided with the slot-shaped perforation openings, wherein a width of the slot-shaped perforation openings maximally corresponds to double the thickness of the essentially planar oxide layer, and wherein the slot-shaped perforation openings are closed by oxide when producing the essentially planar oxide layer, thereby facilitating an essentially planar top surface of the essentially planar oxide layer that opposes the layer having the slot-shaped perforation openings;
    depositing the membrane onto the essentially planar top surface of the essentially planar oxide layer; and
    performing an etching for opening the slot-shaped perforation openings in the layer by removing any oxide from the essentially planar oxide layer that had closed the slot-shaped perforation openings and for producing a cavity in the essentially planar oxide layer between the membrane and the counter element which comprises the layer in which the slot-shaped perforation openings are formed, wherein the length of the slot-shaped perforation openings is at least double the width of the slot-shaped perforation openings but less than half a dimension of the counter element.

2. The method according to claim 1, wherein the width of the slot-shaped perforation openings is 2 μm or less.

3. The method according to claim 1, wherein the slot-shaped perforation openings are arranged in rows and columns.

4. The method according to claim 3, wherein the slot-shaped perforation openings are formed by first slots and second slots which are perpendicular to the first slots.

5. The method according to claim 4, wherein the first and second slots are arranged alternatingly in the counter element.

6. The method according to claim 1, wherein the slot-shaped perforation openings are slots formed in different directions.

7. The method according to claim 1, wherein the slot-shaped perforation openings form slot crosses.

8. The method according to claim 1, wherein slot-shaped perforation openings are arranged in rows and the slot crosses of neighboring rows are offset to one another.

9. The method according to claim 1, wherein the area of the slot-shaped perforation openings basically is 10 to 50% of the entire area of the counter element.

* * * * *